United States Patent
Seo

(10) Patent No.: US 11,621,298 B2
(45) Date of Patent: Apr. 4, 2023

(54) ELECTRONIC DEVICE AND METHOD FOR FABRICATING THE SAME

(71) Applicant: SK hynix Inc., Icheon-si (KR)

(72) Inventor: Sung Kil Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 111 days.

(21) Appl. No.: 16/983,945

(22) Filed: Aug. 3, 2020

(65) Prior Publication Data

US 2021/0375994 A1    Dec. 2, 2021

(30) Foreign Application Priority Data

May 26, 2020    (KR) .......................... 10-2020-0062795

(51) Int. Cl.
  *H01L 27/24* (2006.01)
  *H01L 45/00* (2006.01)

(52) U.S. Cl.
  CPC ...... *H01L 27/2481* (2013.01); *H01L 45/1233* (2013.01); *H01L 45/147* (2013.01); *H01L 45/1641* (2013.01); *H01L 45/1675* (2013.01)

(58) Field of Classification Search
  CPC .................................................. H01L 27/2481
  See application file for complete search history.

(56) References Cited

U.S. PATENT DOCUMENTS

| 2019/0097133 | A1  | 3/2019  | Collins et al. |
| 2020/0287129 | A1* | 9/2020  | Sarkar ...................... H01L 45/06 |
| 2021/0328140 | A1* | 10/2021 | Sun ....................... H01L 45/1226 |

FOREIGN PATENT DOCUMENTS

KR    1020170134377 A    12/2017

* cited by examiner

*Primary Examiner* — Mounir S Amer

(57) ABSTRACT

An electronic device may include a first conductive line, a second conductive line, a memory cell and a liner layer. The first conductive line may be extending in a first direction. The second conductive line may be arranged over the first conductive line and extending in a second direction that intersects with the first direction. The memory cell may be arranged between the first conductive line and the second conductive line in regions of intersection between the first conductive line and the second conductive line. The liner layer may be configured to surround the memory cell in the first direction and the second direction. The liner layer may include a potential well.

17 Claims, 18 Drawing Sheets

ELECTRONIC DEVICE AND METHOD FOR FABRICATING THE SAME

CROSS-REFERENCES TO RELATED APPLICATION

The present application claims priority under 35 U.S.C. § 119(a) to Korean application number 10-2020-0062795, filed on May 26, 2020, in the Korean Intellectual Property Office, which is incorporated herein by reference in its entirety.

BACKGROUND

1. Technical Field

Various embodiments may generally relate to a semiconductor memory circuit or applications of the semiconductor memory circuit in a semiconductor device and an electronic device.

2. Related Art

Recently, as demand increases for electronic devices developed in smaller sizes, with low power consumption, and with diversification, semiconductor devices that are configured to store information in electronic devices such as computers, portable communication devices, and the like, may require study and improvement.

The semiconductor devices may include a resistive random access memory (RRAM), a phase-change random access memory (PRAM), a ferroelectric random access memory (FRAM), a magnetic random access memory (MRAM), an e-fuse, etc., each configured to store data using switching characteristics that arise from different resistance states in accordance with an applied voltage or current.

SUMMARY

Example embodiments provide an electronic device that may include a semiconductor memory having improved reliability.

Example embodiments also provide a method of manufacturing the above-mentioned electronic device.

In example embodiments of the present disclosure, an electronic device may include a first conductive line extending in a first direction; a second conductive line arranged over the first conductive line and extending in a second direction that intersects with the first direction; a memory cell arranged between the first conductive line and the second conductive line in regions of intersection between the first conductive line and the second conductive line; and a liner layer configured to surround the memory cell in the first direction and the second direction, the liner layer including a potential well In example embodiments, the liner layer may include a plurality of layers having different energy band gaps.

In example embodiments, the liner layer may have a multi-layered structure that includes a first layer, a second layer and a third layer, which are sequentially stacked, and wherein the second layer may have an energy band gap that is less than an energy band gap of the first layer and an energy band gap of the third layer.

In example embodiments, the liner layer may have a multi-layered structure that includes a first layer, a second layer and a third layer, which are sequentially stacked, and wherein the first layer and the third layer each includes a metal oxide and the second layer includes a semiconductor nitride.

In example embodiments, the liner layer may have a multi-layered structure that includes a first layer, a second layer and a third layer, which are sequentially stacked, and wherein the first layer and the third layer each includes a hafnium oxide layer and the second layer includes a nitride silicon layer.

In example embodiments, a part of the liner layer may be extended to both sidewalls of the first conductive line in the second direction and may be extended to both sidewalls of the second conductive line in the first direction.

In example embodiments, the memory cell may include a variable resistive material.

In example embodiments of the present disclosure, an electronic device may include a plurality of first conductive lines extending in a first direction; a plurality of second conductive lines arranged over the plurality of first conductive lines and extending in a second direction that intersects with the first direction; a plurality of memory cells arranged at intersections between the plurality of first conductive lines and the plurality of second conductive lines; a first liner layer formed on both sidewalls of each of the plurality of memory cells in the second direction; and a second liner layer formed on the both sidewalls of each of the plurality of memory cells in the first direction. Each of the first liner layer and the second liner layer may include a plurality of layers having different energy band gaps. The electronic device may further include an insulating interlayer that fills areas between the first conductive lines, the second conductive lines and the memory cells. The insulating interlayer may have an energy band gap greater than an energy band gap of an outermost layer in each of the first and second liner layers. Each of the first and second liner layers may have a multi-layered structure that includes a first layer and a second layer, which are sequentially stacked, and wherein the second layer may have an energy band gap that is less than an energy band gap of the first layer and the energy band gap of the insulating interlayer.

In example embodiments, each of the first and second liner layers may have a multi-layered structure that includes a first layer, a second layer and a third layer, which are sequentially stacked, and wherein the second layer may have an energy band gap that is less than an energy band gap of the first layer and an energy band gap of the third layer.

In example embodiments, each of the first and second liner layers may have a multi-layered structure that includes a first layer, a second layer and a third layer, which are sequentially stacked, and wherein the first layer and the third layer each may include a metal oxide and the second layer may include semiconductor nitride.

In example embodiments, each of the first and second liner layers may have a multi-layered structure that includes a first layer, a second layer and a third layer, which are sequentially stacked, and wherein the first layer and the third layer each may include a hafnium oxide layer and the second layer may include a nitride silicon layer.

In example embodiments, ends of both sidewalls of the first liner layer may be configured to contact respective ends of both sidewalls of the second liner layer to surround each of the memory cells in the first and second directions, and wherein the both sidewalls of the first liner layer contact with a lowermost layer of the second liner layer.

In example embodiments, a part of the first liner layer may be extended to both sidewalls of each of the first conductive lines in the first direction, and the part of the first liner layer wholly covers the both sidewalls of each of the first conductive lines and has an uneven shape when viewed from the second direction. A part of the second liner layer may be extended to both sidewalls of each of the second conductive lines in the second direction, and the part of the second liner layer wholly covers the both sidewalls of each of the second conductive lines and has a plate shape when viewed from the first direction. Each of the plurality of memory cells comprises a variable resistive material.

In example embodiments of the present disclosure, according to a method of manufacturing an electronic device, the method may include forming a plurality of line patterns on a substrate, each of the line patterns extending in a first direction and including a first conductive line and a memory pattern, which are sequentially stacked; forming a first liner layer on sidewalls of each of the plurality of line patterns, the first liner layer including a plurality of layers having different energy band gaps; forming an insulating interlayer on the substrate to fill spaces between the line patterns; forming a plurality of second conductive lines on the line patterns and the insulating interlayer, the second conductive lines extending in a second direction intersecting the first direction; and etching the first liner layer, the insulating interlayer and the memory pattern using the second conductive lines as an etch barrier to expose the first conductive line to form a plurality of memory cells; and forming a second liner layer on both sidewalls of each of the memory cells, the etched first liner layer and both sidewalls of the etched insulating interlayer, the second liner layer including a plurality of layers having different energy band gaps.

In example embodiments, each of the first and second liner layers may have a multi-layered structure that include the plurality of layers having different energy band gaps, and wherein the multi-layered structure may have a potential well.

In example embodiments, each of the first and second liner layers may have a multi-layered structure including a first layer, a second layer and a third layer, which are sequentially stacked, and wherein the second layer may have an energy band gap that is less than an energy band gap of the first layer and an energy band gap of the third layer.

According to example embodiments, the liner layer, which may have the multi-layered structure including the layers having the different energy band gaps may be configured to surround each of the memory cells. Thus, when a selected memory cell among the memory cells may be operated, thermal energy may not spread into an adjacent memory cell to improve reliability of a semiconductor memory.

BRIEF DESCRIPTION OF THE DRAWINGS

The above features and advantages of the subject matter of the present disclosure, and other aspects, will be more clearly understood from the following detailed description taken in conjunction with the accompanying drawings, in which:

FIGS. 2A and 2B to FIGS. 6A and 6B are cross-sectional views taken along the line I-I' and the line II-II' in FIG. 1A, illustrating a semiconductor memory of an electronic device in accordance with an embodiment of the disclosure.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Example embodiments may provide an electronic device including a semiconductor memory having improved reliability and a method of manufacturing the electronic device. The semiconductor memory may have a structure configured to prevent the generation of characteristic deterioration in memory cells adjacent to a selected memory cell. Such deterioration may be caused by thermal energy generated when the selected memory cell is operated. The electronic device of embodiments disclosed herein may include a liner layer configured to surround a sidewall of the memory cell. The liner layer may provide a potential barrier configured to prevent the spreading of thermal energy generated in the memory cell. The thermal energy blocked by the liner layer may be related to thermal conductance. Thermal conductance is a concept that is similar to, but different from, thermal conductivity which corresponds to an inherent property of a material. That is, the liner layer in exemplary embodiments may actually control heat transfer to block unnecessary spreading of thermal energy, without transferring thermal energy by conducting thermal energy through the liner layer. Therefore, the spreading of the thermal energy in derogation of device operation is prevented by the inherent properties of the materials in the liner layer.

Figure 1A:
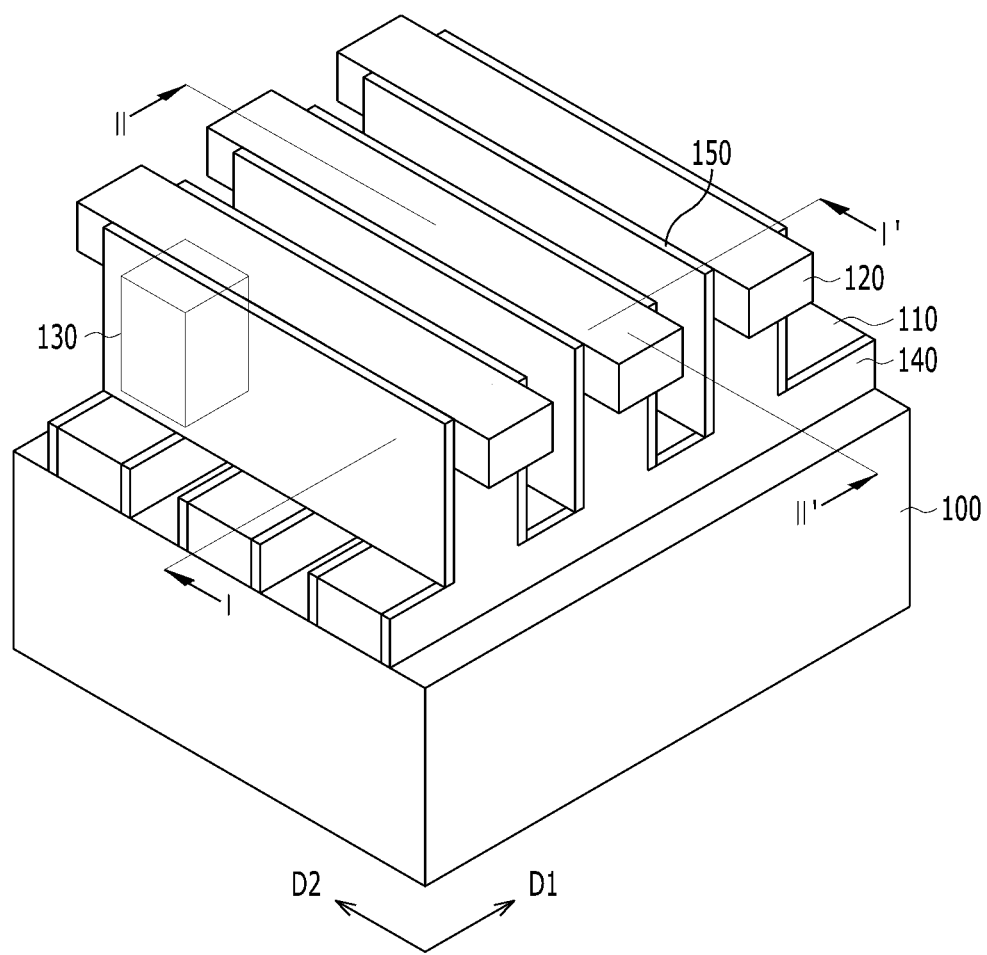
FIG. 1A is a perspective view illustrating a semiconductor memory of an electronic device in accordance with example embodiments.
Figure 1B:
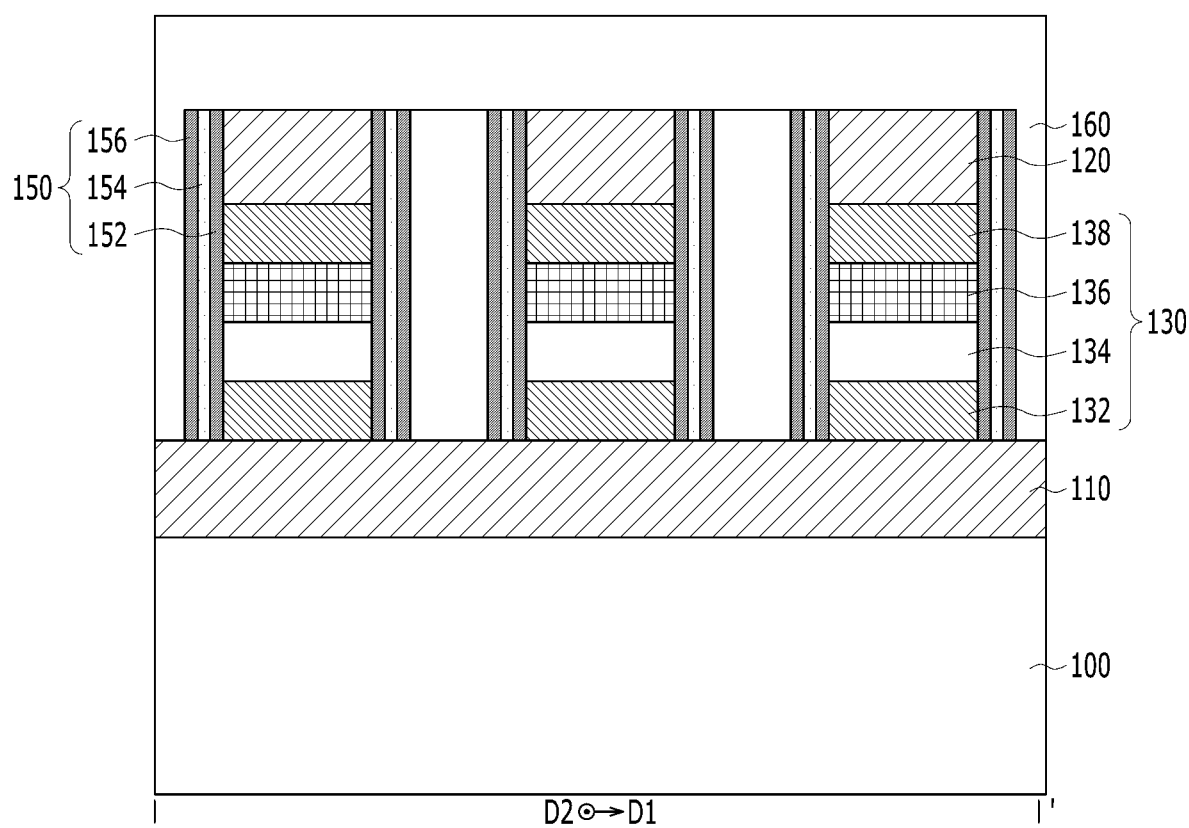
FIG. 1B is a cross-sectional view taken along a line I-I' in FIG. 1A.
Figure 1C:
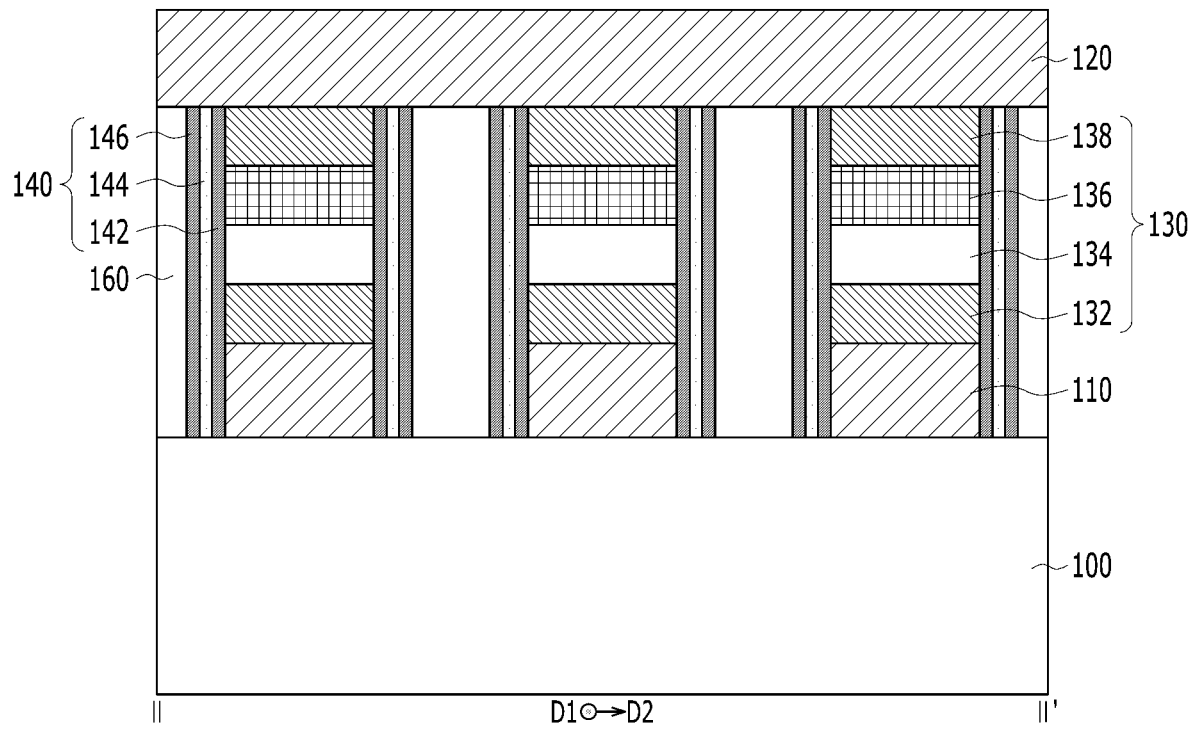
FIG. 1C is a cross-sectional view taken along a line II-II' in FIG. 1A.

FIG. 1A is a perspective view illustrating a semiconductor memory of an electronic device in accordance with embodiments of the disclosure, FIG. 1B is a cross-sectional view taken along a line I-I' in FIG. 1A, and FIG. 1C is a cross-sectional view taken along a line II-II' in FIG. 1A.

Referring to FIGS. 1A to 1C, a semiconductor memory of example embodiments may include a memory cell array on a substrate 100. The memory cell array may include a plurality of first conductive lines 110, a plurality of second conductive lines 120 and a plurality of memory cells 130. The first conductive lines 110 may be extended in a first direction D1. The second conductive lines 120 may be extended in a second direction D2 that intersects with the first direction D1. The memory cells 130 may be positioned between the first conductive lines 110 and the second conductive lines 120. That is, the memory cell array of the semiconductor memory in accordance with embodiments contemplated by the disclosure may have a cross-point array architecture.

For the convenience of explanation, in FIGS. 1A to 1C, the three first conductive lines 110 may be arranged parallel to each other along the second direction D2. The three second conductive lines 120 may be arranged parallel to each other along the first direction D1. Nine memory cells 130 may be arranged between the first conductive lines 110 and the second conductive lines 120. However, the present disclosure is not restricted to the above-mentioned structure and the number of conductive lines and memory cells may vary. Further, in FIGS. 1A to 1C, the memory cell array 130 may be included in a single-deck structure without restriction to the above-mentioned structure. In other embodiments, the memory cell array 130 may have a vertically stacked structure. For example, the memory cell array may have a multi-deck structure including the first conductive lines 110 and the second conductive lines 120 alternately stacked in a vertical direction. In such cases, the memory cells 130 may be positioned between the vertically stacked first and second conductive lines 110 and 120. The memory cell array may include the memory cells 130 arranged in a cross-point array structure to improve an integration degree of the semiconductor memory. Further, the memory cells 130 may be stacked in the multi-deck structure to more improve the integration degree of the semiconductor memory.

The substrate 100 may include a peripheral circuit configured to operate the memory cell array. The peripheral circuit may include NMOS transistors, PMOS transistors, registers and capacitors electrically connected with the memory cell array. The NMOS transistors, the PMOS transistors, the registers and the capacitors may be used as elements of a row decoder, a column decoder, a page buffer and a control circuit. The memory cell array may be arranged on the substrate 100 including the peripheral circuit in order to reduce the area of the substrate 100 occupied by the memory cell array and the peripheral circuit.

Each of the first conductive lines 110 may correspond to a word line or a row line. Each of the second conductive lines 120 may correspond to a bit line or a column line. The word line and the bit line may be relative concepts. Thus, in other embodiments, the first conductive line 110 may correspond to the bit line and the second conductive line 120 may correspond to the word line. In FIGS. 1A to 1C, the first conductive lines 110 may be arranged parallel to each other in the second direction D2. The second conductive lines 120 may be arranged parallel to each other in the first direction D1. A gap between the first conductive lines 110 may be substantially the same as a gap between the second conductive lines 120. The first conductive lines 110 and the second conductive lines 120 may include a conductive material such as polysilicon, metal, etc. For example, the first conductive lines 110 and the second conductive lines 120 may include, for example, tungsten (W), tungsten nitride (WN), tungsten silicide (WSi), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zirconium (Zn), nickel (Ni), cobalt (Co), lead (Pb), platinum (Pt), or a combination thereof.

The memory cells 130 may be arranged at points of intersection between the first conductive lines 110 and the second conductive lines 120. Thus, in a plan view, the memory cells 130 may be arranged in a matrix shape. Each of the memory cells 130 may include a memory stack. The memory cells 130 may include a selection element 134 and a memory element 136 serially connected with each other and vertically stacked. The selection element 134 may be electrically connected to the first conductive line 110. The memory element 136 may be electrically connected to the second conductive line 120. The memory element 136 may include a variable resistive material such as a resistive material, a magnetic tunnel junction (MTJ), a phase-change material, etc. The selection element 134 may include a switching material for selecting any one of the memory cells 130. For example, the selection element 134 may include a diode, a PNP diode, a bipolar junction transistor (BJT), a metal insulator transistor (MIT), a mixed ionic-electronic conduction (MIEC), an Ovonic threshold switch (OTS), or similar elements. Memory cells 130 may have various different shapes and configurations. For example, the selection element 134 may be omitted, or the positions of the selection element 134 and the memory element 136 may be changed relative to each other or relative to other elements.

Each of the memory cells 130 may include a memory stack. The memory stack may include a lower electrode 132, a switching pattern operated as the selection element 134, a variable resistive pattern operated as the memory element 136 and an upper electrode 138. The lower electrode 132, the switching pattern 134, the variable resistive pattern 136 and the upper electrode 138 may be sequentially stacked on or over the substrate 100. Although not depicted in the drawings, a middle electrode may be interposed between the switching pattern and the variable resistive pattern. In order to improve characteristics such as reliability of the memory cell 130 or to improve a manufacturing process, an interface between memory stacks may be improved. For example, at least one insertion layer may be further formed between the memory stacks.

The variable resistive pattern (memory element 136) may have a reversible transition characteristic between different resistance states in response to an applied voltage or current. For example, when the variable resistive pattern has a low resistance state, a data of "1" may be stored. In contrast, when the variable resistive pattern has a high resistance state, a data of "0" may be stored.

If the variable resistive pattern includes a resistive material, then the variable resistive pattern may include transition metal oxide or metal oxide such as perovskite. Thus, an electric path may be generated or disconnected in the variable resistive pattern, and the state of the electric path may be used to store data.

When the variable resistive pattern has an MTJ structure, the variable resistive pattern may include a fixed magnetization layer, a free magnetization layer and a tunnel barrier layer interposed between the fixed magnetization layer and the free magnetization layer. For example, the fixed magnetization layer and the free magnetization layer may include a magnetic material. The tunnel barrier layer may include oxide such as Mg, Al, Zn, Ti, etc. A magnetization direction of the free magnetization layer may be changed by spin torques of electrons under an applied current. Thus, data may be stored in accordance with changes in the magnetization direction in the free magnetization layer, namely, with respect to the magnetization direction of the fixed magnetization layer.

When the variable resistive pattern includes a phase-change material, the variable resistive pattern may include a chalcogenide material. For example, the variable resistive pattern may include silicon (Si), germanium (Ge), antimony (Sb), tellurium (Te), bismuth (Bi), indium (In), tin (Sn), selenium (Se) or a combination thereof. In more particular examples, the variable resistive pattern may include Ge—Sb—Te(GST) such as Ge2Sb2Te5, Ge2Sb2Te7, Ge1Sb2Te4, Ge1Sb4Te7, or similar compounds. A chemical composition ratio of a material used in the variable resistive pattern may be determined in accordance with desired characteristics such as a melting point, a crystallization temperature, etc. The variable resistive pattern may further include an impurity such as carbon (C), nitrogen (N), or the like. The phase-change material may have low resistance characteristics in a crystalline state. The phase-change material may have high resistance characteristics in an amorphous state. For example, the phase-change material may perform a set operation in which the high resistance of the amorphous state may be changed into the low resistance of the crystalline state, or a reset operation in which the low resistance of the crystalline state may be changed into the high resistance of the amorphous state to store the data.

The switching pattern (selection element 134) may be configured to control a flow of a current in accordance with a size of a voltage or a current. Thus, when an applied voltage or current is no greater than a critical or threshold value, the switching pattern may allow no current, or almost no current, to flow. In contrast, when the applied voltage or the current is greater than the critical value, the switching pattern may allow a flow of current that increases in proportion to the magnitude of the applied voltage or the current.

When the switching pattern includes the metal insulator transition (MIT) element, the switching pattern may include $VO_2$, $NbO_2$, $TiO_2$, $WO_2$, $TiO_2$, and similar oxides. When the switching pattern includes a mixed ion-electron conducting (MIEC) element, the switching pattern may include $ZrO_2$ ($Y_2O_3$), $Bi_2O_3$—BaO, $(La_2O_3)_x(CeO_2)_{1-x}$, and the like. Further, when the switching pattern includes an ovonic threshold switching (OST) element, the switching pattern may include a chalcogenide material such as $As_2Te_3$, $As_2$, and $As_2Se_3$ as non-limiting examples.

The lower electrode 132 may be electrically connected to the first conductive line 110. The upper electrode 138 may be electrically connected to the second conductive line 120. The lower electrode 132 and the upper electrode 138 may include a conductive material such as metal, metal nitride, or similar materials. For example, the lower electrode 132 and the upper electrode 138 may include tungsten (W), tungsten nitride (WN), tungsten silicide (WSi), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zirconium (Zn), nickel (Ni), cobalt (Co), lead (Pb), platinum (Pt), or a combination thereof. The lower electrode 132 and the upper electrode 138 may have a single-layered structure or a multi-layered structure. When the lower electrode 132 and the upper electrode 138 have a multi-layered structure, an interface electrode may be configured to contact the variable resistive pattern or the switching pattern. Further, the lower electrode 132 and the upper electrode 138 may have substantially the same thickness or substantially different thicknesses.

The semiconductor memory may include a first liner layer 140 and a second liner layer 150. The first liner layer 140 may be formed on both sidewalls of each of the memory cells 130 in the second direction D2. A part of the first liner layer 140 may be extended to both sidewalls of the first conductive lines 110. The second liner layer 150 may be formed on the both sidewalls of each of the memory cells 130 in the first direction D1. A part of the second liner layer 150 may be extended to both sidewalls of the second conductive lines 120. The portions of first liner layer 140 extended to the both sidewalls of the first conductive lines may be configured to wholly cover the both sidewalls of the first conductive lines. The first liner layer 140 may have an uneven shape, or a shape including a square-tooth like edge, viewed from the second direction D2. The portions of second liner layer 150 extended to the both sidewalls of the second conductive lines 120 may be configured to wholly cover the both sidewalls of the second conductive lines 120. Therefore, in contrast to first liner layer 140, the second liner layer 150 may have a plate shape viewed from the first direction D1.

The first liner layer 140 and the second liner layer 150 may function as to prevent characteristic deterioration of an adjacent memory cell 130 caused by thermal energy transferred from a selected memory cell 130 that generates thermal energy during operation. Each of the first liner layer 140 and the second liner layer 150 may have a multi-layered structure including a plurality of layers having different energy band gaps. Because the first liner layer 140 and the second liner layer 150 may include stacked layers that have different energy band gaps, a potential barrier may be formed between the layers. The potential barrier between the layers may function to prevent thermal conductance. Ends of both sidewalls of the first liner layer 140 may contact ends of both sidewalls of the second liner layer 150 in the first direction D1 so that each of the memory cells 130 is fully surrounded by liner layers.

The first liner layer 140 may include a first layer 142, a second layer 144 and a third layer 146 that are sequentially stacked. The first layer 142, the second layer 144 and the third layer 146 may be configured to contact, in the second direction D2, both sidewalls of each of the memory cells 130 and both sidewalls of each of the first conductive lines 110. The both sidewalls of the first liner layer 140 may be aligned with the sidewalls of the memory cell 130.

In order to effectively prevent thermal energy, which may be generated in operating the selected memory cell 130, from being transferred to the adjacent memory cells, the energy band gaps of the first layer 142 and the third layer 146 may be greater than the energy band gap of the second layer 144. Thus, a potential well may be formed in the first liner layer 140. Each of the first layer 142, the second layer 144 and the third layer 146 may include insulation materials. The first layer 142 and the third layer 146 may include the same metal oxide. The second layer 144 may include a semiconductor nitride. The first layer 142 and the third layer 146, which include a metal oxide, may function to improve interface characteristics between each of the first and the third layers 142 and 146 and structures that contact the first and third layers 142 and 146. Structures that contact the first and third layers 142 and 146 include, for example, the first conductive lines 110, the memory cells 130 and an insulation interlayer 160 (not illustrated in FIG. 1A). The second layer 144, which may include a semiconductor nitride material, may function to cure and restore any damage at the sidewalls of the memory cell 130 at the interface with the first layer 142, such as for example, the formation of an oxidized sidewall of the memory cell 130 adjacent to the first layer 142.

For example, the first layer 142 and the third layer 146 may include a hafnium oxide ($HfO_2$) layer having an energy band gap of about 7 eV. The second layer 144 may include a nitrite silicon ($SiN_4$) layer having an energy band gap of about 4 eV. Nitrite silicon may be used for the second layer 144 in place of silicon nitride ($Si_3N_4$) so that a potential well may be more easily formed because the energy band gap of the nitrite silicon may be less than the energy band gap of the silicon nitride, and therefore stresses applied to previously formed structures (ex. memory cell 130) may be low. Further, the greater amount of the nitrogen in nitrite silicon may function as to readily cure and restore sidewalls of the memory cell 130 oxidized in forming the first layer 142. The energy band gap of each of the materials may be a difference between an energy level of a conduction band and an energy level of a valence band. The energy band gap of each of the materials may be an approximate value because an energy band gap may be slightly changed depending on formation conditions.

The second liner layer 150 may include a fourth layer 152, a fifth layer 154 and a sixth layer 156, which are sequentially stacked. The fourth layer 152, the fifth layer 154 and the sixth layer 156 may be configured to contact, in the first direction D1, the both sidewalls of each of the memory cells 130 and the both sidewalls of each of the second conductive lines 120. The fourth layer 152, the fifth layer 154 and the sixth layer 156 in the second liner layer 150 may be substantially the same as the first layer 142, the second layer 144 and the third layer 146 in the first liner layer 140, respectively. The second liner layer 150 may be configured to cover portions of sidewalls of the first liner layer 140. The sidewall of the first liner layer 140 may be configured to contact portions of the fourth layer 152 of the second liner layer 150. In other words, the sidewall of each of the first layer 142, the second layer 144 and the third layer 146 may be configured to contact portions of the fourth layer 152 of the second liner layer 150. This structure in which the both sidewalls of the first liner layer 140 contact with a lowermost layer (fourth layer 152) of the second liner layer 150 may function as to effectively block the spread of the thermal energy through a contact region between the first liner layer 140 and the second liner layer 150, i.e., through a corner region of the memory cell 130.

In order to effectively prevent thermal energy, which may be generated in operating the selected memory cell 130, from being transferred to the adjacent memory cells, the energy band gaps of the fourth layer 152 and the sixth layer 156 may be greater than the energy band gap of the fifth layer 154. Thus, a potential well may be formed in the second liner layer 150. Each of the fourth layer 152, the fifth layer 154 and the sixth layer 156 may include insulation materials. The fourth layer 152 and the sixth layer 156 may include the same metal oxide. The fourth layer 152 may include a material substantially the same as that of the first layer 142. The sixth layer 156 may include a material substantially the same as that of the third layer 146. The fifth layer 154 may include a semiconductor nitride. For example, the fourth layer 152 and the sixth layer 156 may include a hafnium oxide ($HfO_2$) layer having an energy band gap of about 7 eV. The fifth layer 154 may include a nitrite silicon ($SiN_4$) layer having an energy band gap of about 4 eV.

Further, the semiconductor memory may include the insulating interlayer 160 formed on the substrate 100. The insulating interlayer 160 may be configured to fill spaces between the first conductive lines 110 and the second conductive lines 120. The insulating interlayer 160 may have an energy band gap greater than the energy band gaps of outermost layers of the first liner layer 140 and the second liner layer 150 (i.e., the third layer 146 and the sixth layer 156). The insulating interlayer 160 may be designed, together with the first liner layer 140 and the second liner layer 150, to effectively block thermal energy, generated in operating the selected memory cell 130, from reaching adjacent memory cells. For example, the insulating interlayer 160 may include a silicon oxide layer having an energy band gap of about 8 eV.

In exemplary embodiments, each of the first liner layer 140 and the second liner layer 150 may include three layers, but embodiments of the disclosure are not restricted to the above-mentioned structures and their roles. For example, when the energy band gap of the insulating interlayer 160 is greater than the energy band gap of the outermost layers in the first liner layer 140 and the second liner layer 150, the first liner layer 140 may include only the first layer 142 and the second layer 144, sequentially stacked, and the second liner layer 150 may only include the fourth layer 152 and the fifth layer 154, sequentially stacked. Consequently, the insulating interlayer 160 may have a function substantially the same as that of the third layer 146 of the first liner layer 140 and the sixth layer 156 of the second liner layer 150 in forming potential wells in the first liner layer 140 and the second liner layer 150.

According to exemplary embodiments, a semiconductor memory may include a first liner layer 140 and a second liner layer 150 configured to surround each of the memory cells 130 in the first and second directions. The first liner layer 140 and the second liner layer 150 may include layers having different energy band gaps to prevent the spreading of thermal energy generated in operating the selected memory cell 130, from the selected memory cell 130 to the adjacent memory cells. Therefore, such semiconductor memory devices may have improved reliability.

FIGS. 2A and 2B to FIGS. 6A and 6B are cross-sectional views taken along the line I-I' and the line II-II' in FIG. 1A, illustrating a semiconductor memory of an electronic device in accordance with an embodiment of the disclosure. FIGS. 2A and 2B to FIGS. 6A and 6B illustrate steps in a method of fabricating an exemplary semiconductor device.

Figure 2A:
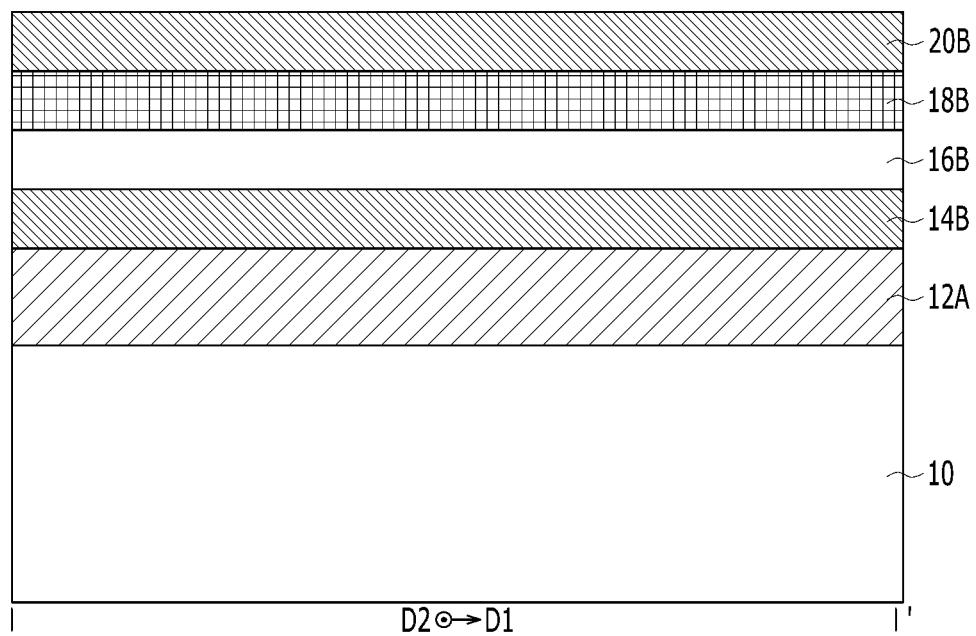
Figure 2B:
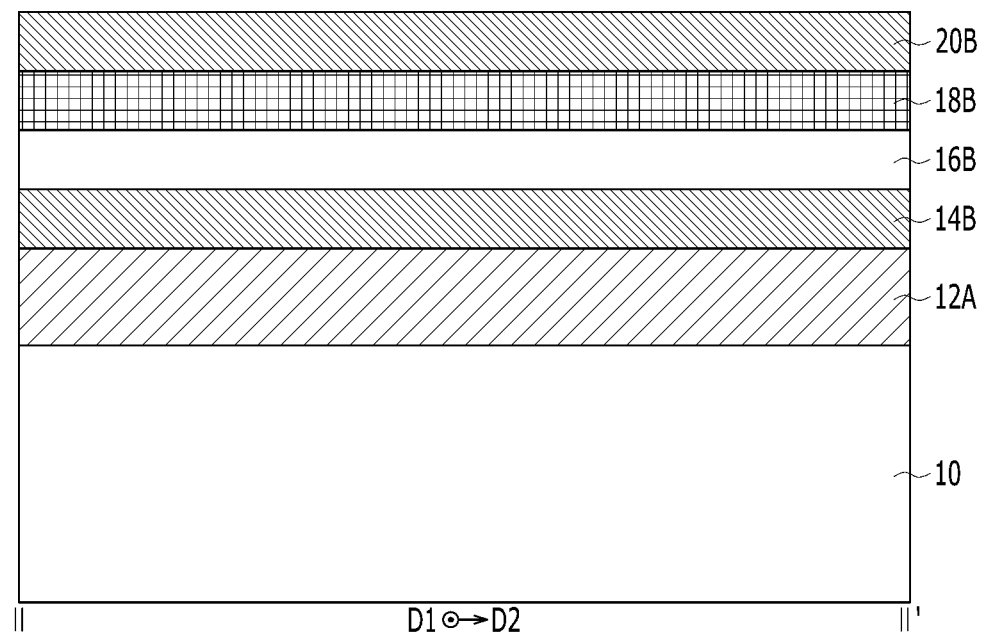

Referring to FIGS. 2A and 2B, a first conductive layer 12A, a first electrode layer 14B, a switching layer 16B, a variable resistive layer 18B and a second electrode layer 20B may be sequentially formed on a substrate 10. A structure, such as for example a peripheral circuit for driving a memory cell array, is not illustrated but may also be formed on the substrate 10.

The first conductive layer 12A, the first electrode layer 14B and a second conductive layer (not illustrated in FIGS. 2A and 2B) may each include a conductive material such as polysilicon, metal, and the like. The first conductive layer 12A, the first electrode layer 14B and the second conductive layer may include, for example, tungsten (W), tungsten nitride (WN), tungsten silicide (WSi), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zirconium (Zn), nickel (Ni), cobalt (Co), lead (Pb), platinum (Pt), or a combination thereof.

The switching layer 16B may be configured to control a flow of a current in accordance with a size or magnitude of a voltage or a current. For example, the switching layer 16B may include $VO_2$, $NbO_2$, $TiO_2$, $WO_2$, $TiO_2$, $ZrO_2(Y_2O_3)$, $Bi_2O_3$—BaO, $(La_2O_3)_x(CeO_2)_{1-x}$, $As_2Te_3$, $As_2$, $As_2Se_3$, or a combination thereof.

The variable resistive layer 18B may include a material having a reversible transition characteristic between different resistance states in response to an applied voltage or current. For example, the variable resistive layer 18B may include transition metal oxide, metal oxide such as perovskite, a magnetic material, chalcogenide, etc.

Figure 3A:
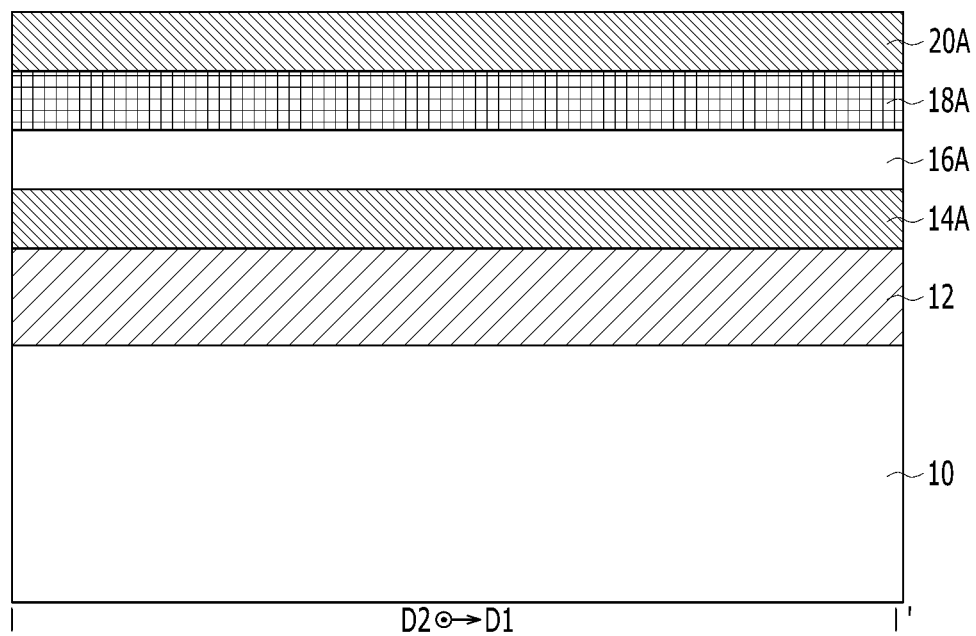
Figure 3B:
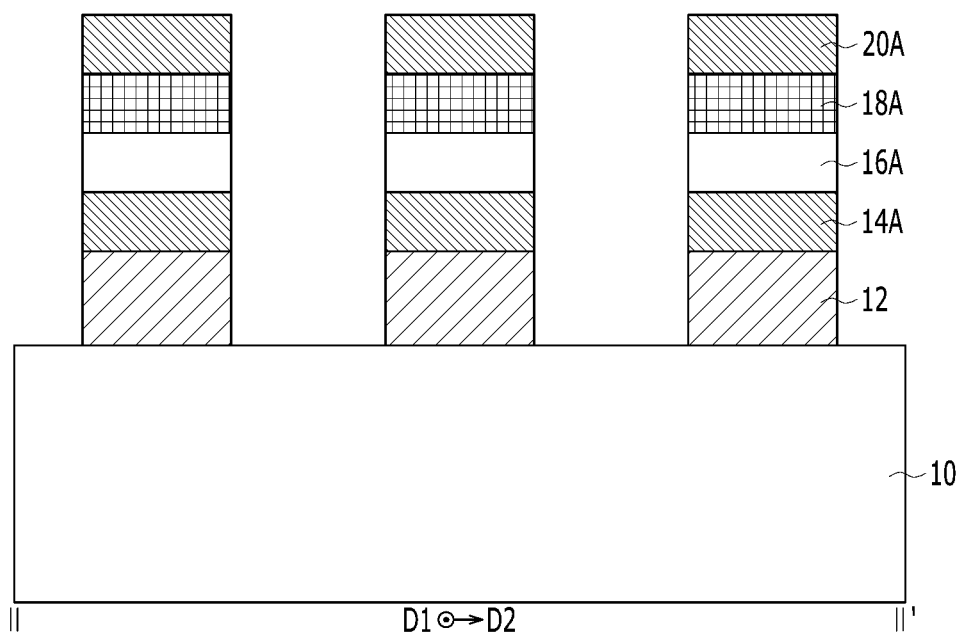

Referring to FIGS. 3A and 3B, next a mask pattern (not illustrated) may be formed on the second electrode layer 20B. The second electrode layer 20B, the variable resistive layer 18B, the switching layer 16B, the first electrode layer 14B and the first conductive layer 12A may be etched using the mask pattern as an etch barrier. Thus, a plurality of first line patterns extending in the first direction D1 may be formed. The first line patterns may be arranged spaced apart from each other along the second direction D2 with a uniform gap between the first line patterns. Each of the first line patterns may include a first conductive line 12 and a memory pattern. A memory pattern may include a preliminary lower electrode 14A, a preliminary switching pattern 16A, a preliminary variable resistive pattern 18A and a preliminary upper electrode 20A sequentially stacked on or over the first conductive line 12. The preliminary lower electrode 14A, the preliminary switching pattern 16A, the preliminary variable resistive pattern 18A and the preliminary upper electrode 20A may each be a substantially linear pattern that extends in the first direction D1, similar to the first conductive line 12.

The mask pattern for forming the first line patterns may then be removed. Alternatively, the first mask pattern for forming the first line patterns may be removed in a process that follows for forming a first insulating interlayer 30 (not illustrated in FIG. 1A).

Figure 4A:
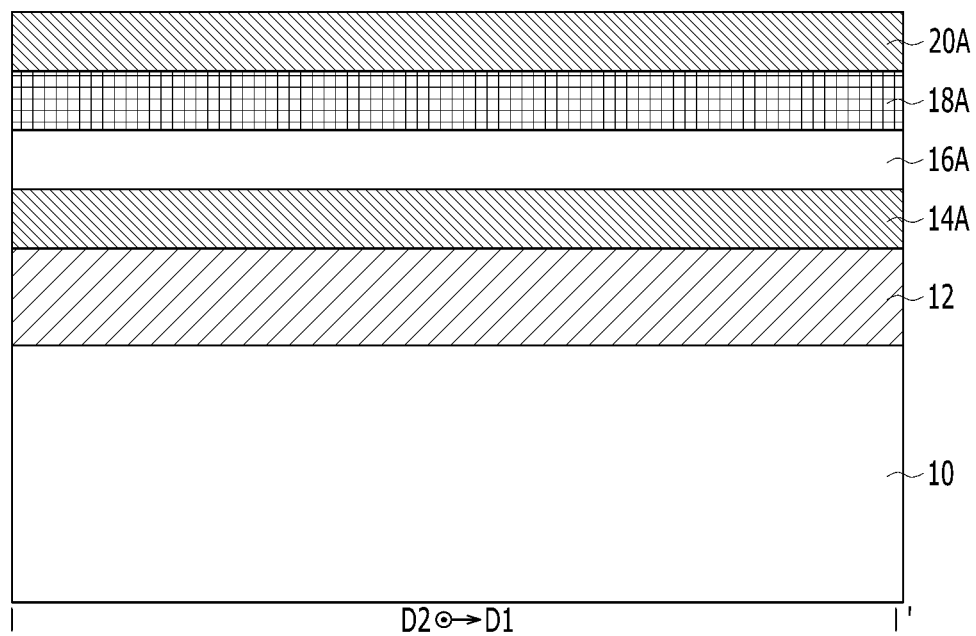
Figure 4B:
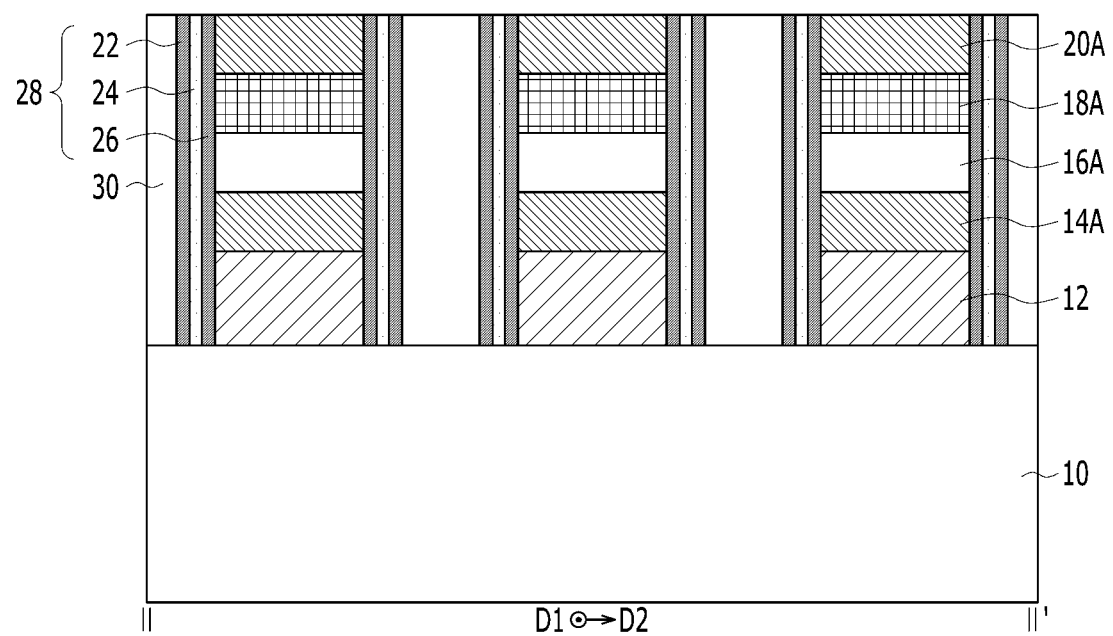

Referring to FIGS. 4A and 4B, a first liner layer 28 may be formed on both sidewalls in the second direction D2 of each of the first line patterns, which include a first conductive line 12, a preliminary lower electrode 14A, a preliminary switching pattern 16A, a preliminary variable resistive pattern 18A and a preliminary upper electrode 20A.

The first liner layer 28 may be formed by sequentially forming a first layer 26, a second layer 24 and a third layer 22 on the substrate 10 to cover the first line patterns. An etching process may then be performed to result in the first layer 26, the second layer 24 and the third layer 22 disposed on the both sidewalls of each of the first line patterns in the second direction D2. The first layer 26, second layer 24 and third layer 22 may have the same or substantially the same thicknesses. In addition, the first layer 26, the second layer 24 and the third layer 22 may have different energy band gaps. In particular, the energy band gaps of the first layer 26 and the third layer 22 may be greater than the energy band gap of the second layer 24. The first layer 26 and the second layer 22 may include the same metal oxide. The second layer 24 may include a semiconductor nitride. For example, the first layer 26 and the third layer 22 may include a hafnium oxide layer having an energy band gap of about 7 eV. The second layer 24 may include a nitrite silicon layer having an energy band gap of about 4 eV.

A first insulating interlayer 30 may be formed in the spaces between adjacent first line patterns, such as for example between the first liner layers 28 disposed on adjacent first line patterns. The first insulating interlayer 30 may be formed by filling the spaces between the first line patterns with an insulation layer, and then planarizing the first insulating interlayer 30 until the preliminary upper electrode 20A is exposed. The first insulating interlayer 30 may include an insulation material having an energy band gap greater than that of an outermost layer of the first liner layer 28, i.e., the third layer 22. For example, the first insulating interlayer 30 may include a silicon oxide layer or material.

Figure 5A:
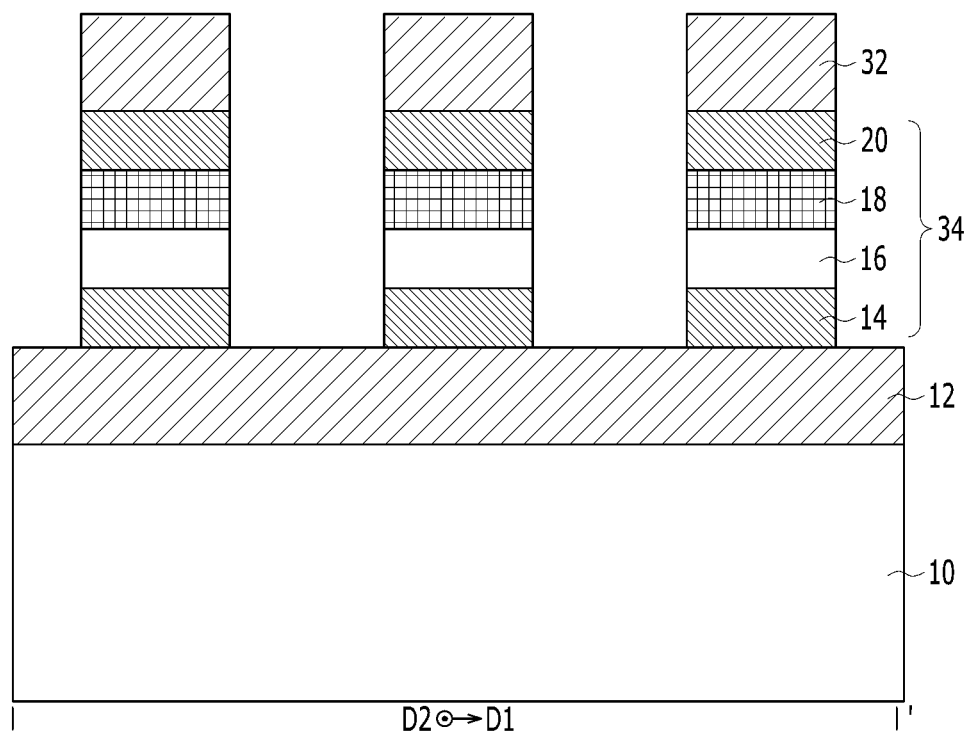
Figure 5B:
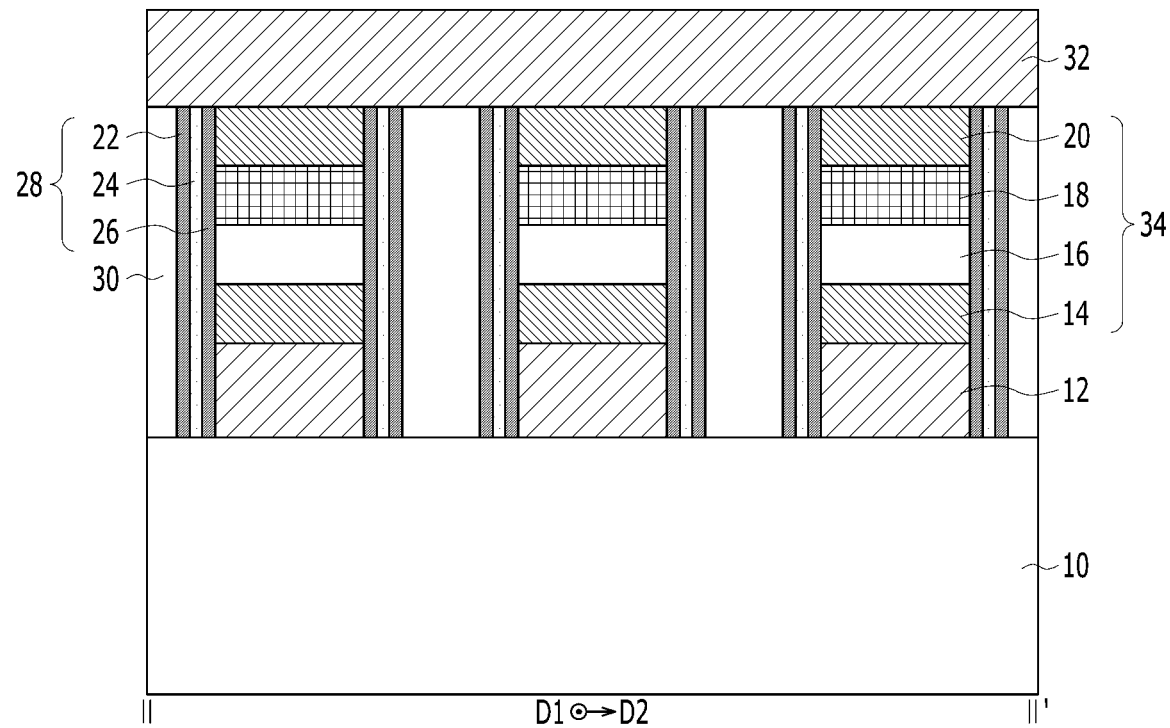

Referring to FIGS. 5A and 5B, a second conductive layer and a mask pattern may be sequentially formed on the first line patterns and the first insulating interlayer 30. The second conductive layer may be etched using the mask pattern as an etch barrier to form second conductive lines 32. The second conductive lines 32 may be arranged parallel to each other and spaced apart in the first direction D1 while extending in the second direction.

In some embodiments, the first insulating interlayer 30 and the first liner layer 28 may be etched using the mask pattern and the second conductive lines 32 as an etch barrier until the first conductive line 12 is exposed. Simultaneously, the preliminary lower electrode 14A, the preliminary switching pattern 16A, the preliminary variable resistive pattern 18A and the preliminary upper electrode 20A of each of the first line patterns may be etched. Therefore, a memory cell 34 including a lower electrode 14, a switching pattern 16, a variable resistive pattern 18 and an upper electrode 20, which are sequentially stacked between the first conductive line 12 and the second conductive line 32, may be formed. A plurality of second line patterns that each includes a second conductive line 32, a plurality of memory cells 34 and the first insulating interlayer 30 may be formed. The plurality of memory cells 34 and the first insulating interlayer 30 may be alternately arranged under the second conductive line 32.

After the etching process, the first liner layer 28 may remain on the both sidewalls of the memory cell 34 and the both sidewalls of the first conductive line 12 along the second direction D2. Further, the mask pattern may be removed during the etching process, or the mask pattern may be removed by an additional process after finishing the etching process.

Figure 6A:
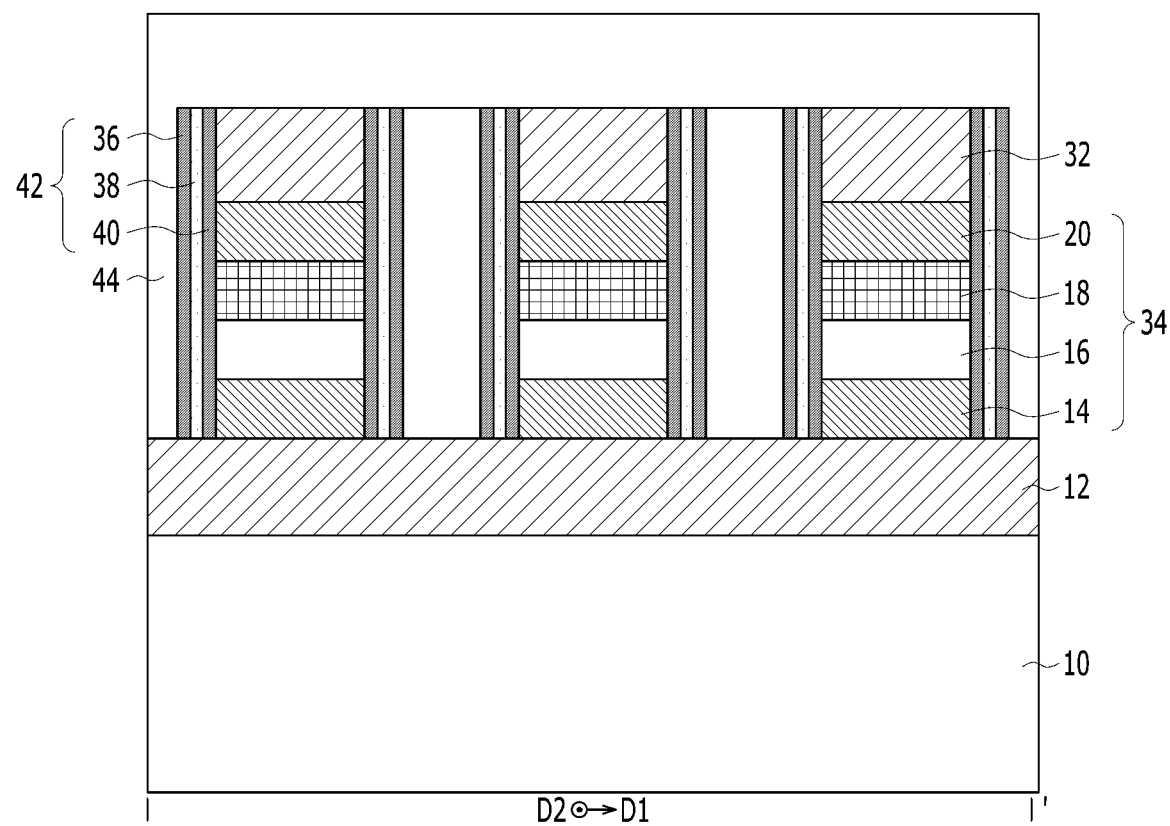
Figure 6B:
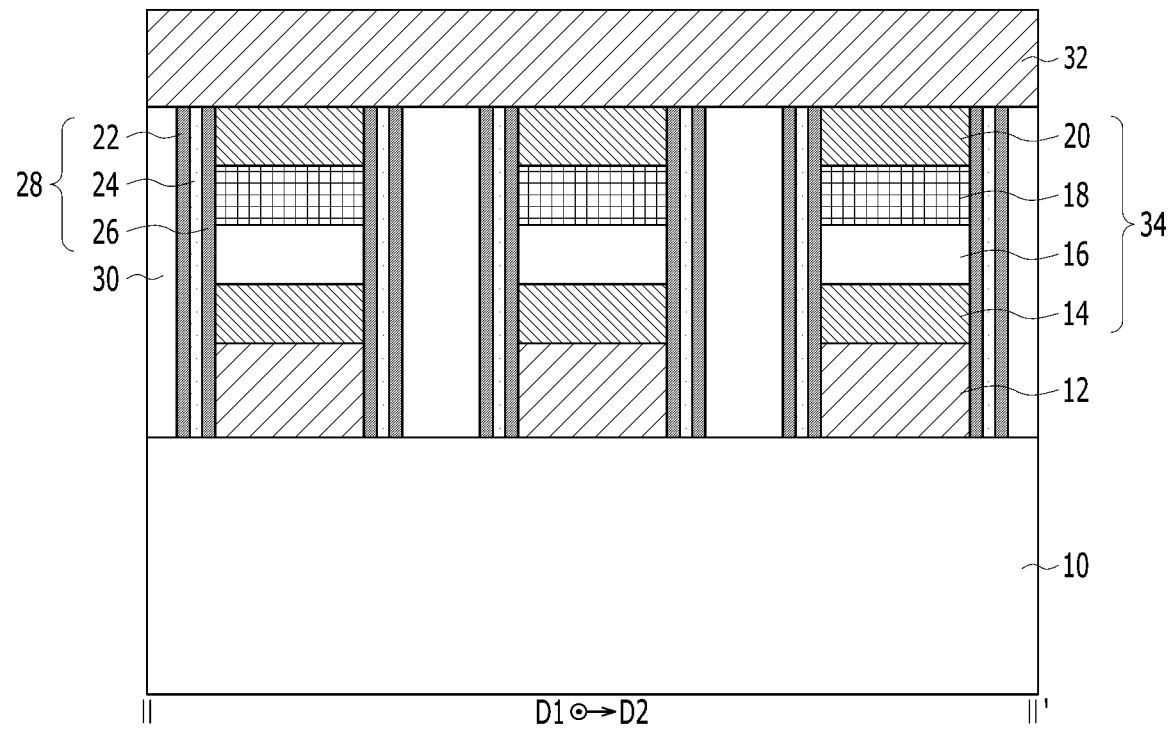

Referring to FIGS. 6A and 6B, a second liner layer 42 may be formed on sidewalls of each of the second line patterns. The second liner layer 42 may be formed by sequentially forming a fourth layer 40, a fifth layer 38 and a sixth layer 36, having a uniform thicknesses, to cover areas or regions between the second line patterns, and then performing an etching process to form the fourth layer 40, the fifth layer 38 and the sixth layer 36 on the both sidewalls of each of the second line patterns and exposing as required the top of the second conductive line 32 and portions of the first conductive line 12 and the first insulating interlayer 30. The fourth layer 40, the fifth layer 38 and the sixth layer 36 may be substantially the same as the first layer 26, the second layer 24 and the third layer 22, respectively. The fourth layer 40, the fifth layer 38 and the sixth layer 36 may have different energy band gaps. In particular, the energy band gaps of the fourth layer 40 and the sixth layer 36 may be greater than the energy band gap of the fifth layer 38. The fourth layer 40 and the sixth layer 36 may include the same metal oxide. The fifth layer 38 may include a semiconductor nitride. For example, the fourth layer 40 and the sixth layer 36 may include a hafnium oxide layer having an energy band gap of about 7 eV. The fifth layer 38 may include a nitrite silicon layer having an energy band gap of about 4 eV.

A second insulating interlayer 44 may be formed in spaces between the second line patterns, i.e., between the second liner layers 42 of the second line patterns. The second insulating interlayer 44 (not illustrated in FIG. 1A) may be formed by filling the spaces between the second line patterns with an insulation layer, and then planarizing the insulation layer until the second conductive line 32 is exposed. The second insulating interlayer 44 may include an insulation material having an energy band gap greater than that of an outermost layer of the second liner layer 42, i.e., the sixth layer 36. The second insulating interlayer 44 may include a material substantially the same as that of the first insulating interlayer 30. For example, the second insulating interlayer 44 may include a silicon oxide layer or material.

Well-known processes may be used to form a complete a semiconductor memory with embodiments disclosed herein.

The semiconductor memory in accordance with implementations of the present disclosure may be applied to diverse electronic devices or systems. FIGS. 7 to 11 include examples of electronic devices or systems that can implement the semiconductor memory disclosed herein.

Figure 7:
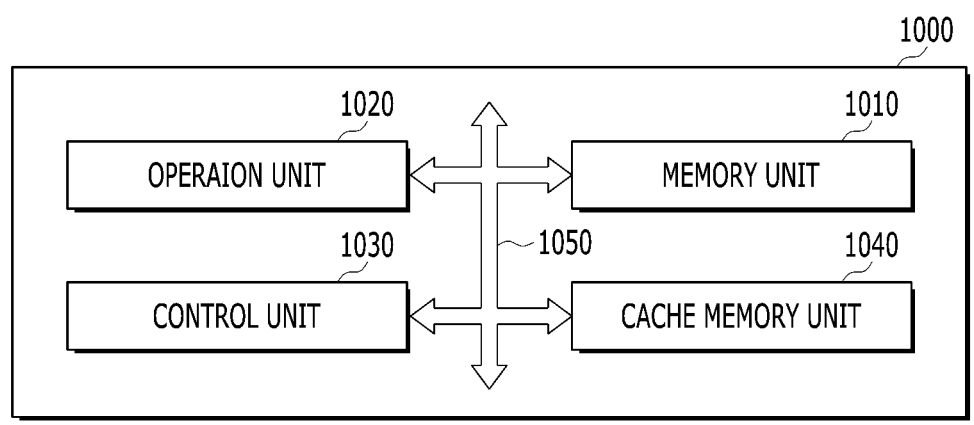
FIG. 7 is an example of a configuration diagram of a microprocessor implementing memory circuitry based on implementations of the disclosed technology.

FIG. 7 is an example of a configuration diagram of a microprocessor implementing memory circuitry based on implementations of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, and a control unit 1030. The microprocessor 1000 may be various data processing units such as a central processing unit (CPU), a graphic processing unit (GPU), a digital signal processor (DSP) and an application processor (AP).

The memory unit 1010 is a part that stores data in the microprocessor 1000, as a processor register, register or the like. The memory unit 1010 may include a data register, an address register, a floating point register and so on. Besides, the memory unit 1010 may include other various registers. The memory unit 1010 may perform the function of temporarily storing data for which operations are to be performed by the operation unit 1020, result data of performing the operations, and addresses where data for performing of the operations are stored.

The memory unit 1010 may include one or more of the above-described semiconductor devices in accordance with disclosed embodiments. The memory unit 1010 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction that intersects with the first direction. The memory cell may be positioned between the first conductive line and the second conductive line. The liner layer may be configured to surround the memory cell. The liner layer may include a potential well. Therefore, semiconductor memories with improved operation characteristics may be provided. Through this, the memory unit 1010 and the microprocessor 1000 may have improved reliability.

The operation unit 1020 may perform four arithmetical operations or logical operations according to results that the control unit 1030 decodes as commands. The operation unit 1020 may include at least one arithmetic logic unit (ALU).

The control unit 1030 may receive signals from the memory unit 1010, the operation unit 1020 and an external device of the microprocessor 1000, perform extraction, decoding of commands, and controlling input and output of signals of the microprocessor 1000, and may execute processing represented by programs.

The microprocessor 1000 according to the present implementation may additionally include a cache memory unit 1040 that can temporarily store data, to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
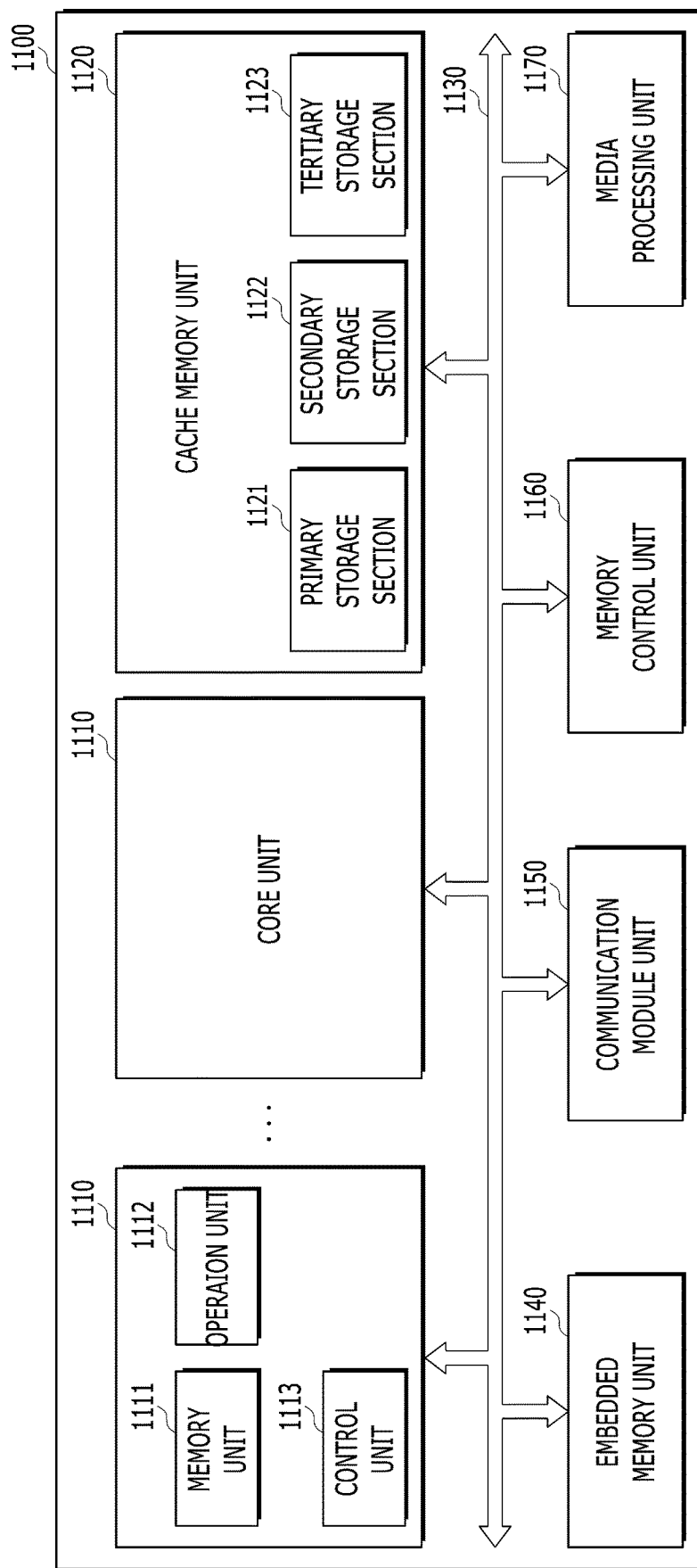
FIG. 8 is an example of a configuration diagram of a processor implementing memory circuitry based on implementations of the disclosed technology.

FIG. 8 is an example of a configuration diagram of a processor implementing memory circuitry based on implementations of the disclosed technology.

Referring to FIG. 8, a processor 1100 may improve performance and realize multi-functionality by including various functions other than those of a microprocessor that performs tasks for controlling and tuning a series of processes of receiving data from various external devices, processing the data, and outputting processing results to external devices. The processor 1100 may include a core unit 1110 that serves as the microprocessor, a cache memory unit 1120 that serves to store data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part that performs arithmetic logic operations for data inputted from an external device, and may include a memory unit 1111, an operation unit 1112 and a control unit 1113.

The memory unit 1111 is a part that stores data in the processor 1100 as a processor register, a register or the like. The memory unit 1111 may include a data register, an address register, a floating point register and so on. Besides these, the memory unit 1111 may include various other registers. The memory unit 1111 may perform the function of temporarily storing data for which operations are to be performed by the operation unit 1112, result data of performing the operations, and addresses where data for performing of the operations are stored. The operation unit 1112 is a part that performs operations in the processor 1100. The operation unit 1112 may perform four arithmetical operations, logical operations, according to results that the control unit 1113 decodes as commands, or the like. The operation unit 1112 may include at least one arithmetic logic unit (ALU). The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part that temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 where high storage capacity is required. As the occasion demands, the cache memory unit 1120 may include an increased number of storage sections. That is to say, the number of storage sections that are included in the cache memory unit 1120 may be changed according to a design requirement. The speeds at which the primary, secondary and tertiary storage sections 1121, 1122 and 1123 store and discriminate data may be the same or different. If the speeds of the respective storage sections 1121, 1122 and 1123 are different, then the speed of the primary storage section 1121 may be fastest. At least one storage section of the primary storage section 1121, the secondary storage section 1122 and the tertiary storage section 1123 of the cache memory unit 1120 may include one or more of the above-described semiconductor devices in accordance with embodiments of the disclosure. For example, the cache memory unit 1120 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction intersecting with the first direction. The memory cell may be positioned between the first conductive line and the second conductive line. The liner layer may be configured to surround the memory cell. The liner layer may include a potential well. Therefore, semiconductor memories with improved operation characteristics may be utilized. Through this, the cache memory unit 1120 and the processor 1100 may have improved reliability.

Although it was shown in FIG. 8 that all of the primary, secondary and tertiary storage sections 1121, 1122 and 1123 are configured inside the cache memory unit 1120, it is to be noted that all of the primary, secondary and tertiary storage sections 1121, 1122 and 1123 of the cache memory unit 1120 may be configured outside the core unit 1110, and may compensate for a difference in data processing speed between the core unit 1110 and the external device. Meanwhile, it is to be noted that the primary storage section 1121 of the cache memory unit 1120 may be disposed inside the core unit 1110, while the secondary storage section 1122 and the tertiary storage section 1123 may be configured outside the core unit 1110, in order to strengthen the function of compensating for a difference in data processing speed. In another implementation, the primary and secondary storage sections 1121 and 1122 may be disposed inside the core units 1110, and tertiary storage sections 1123 may be disposed outside core units 1110.

The bus interface 1130 is a part that connects the core unit 1110, the cache memory unit 1120, and external device, and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected, or be connected through the bus interface 1130. The plurality of core units 1110 may be configured in the same way as the above-described configuration of the core unit 1110. If the processor 1100 includes a plurality of core units 1110, then the primary storage section 1121 of the cache memory unit 1120 may be distributed in each core unit 1110 in correspondence to the number of the plurality of core units 1110, and the secondary storage section 1122 and the tertiary storage section 1123 may be configured outside of the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be distributed in each core unit 1110 in correspondence to the number of the plurality of core units 1110, and the tertiary storage section 1123 may be configured outside of the plurality of core units 1110 in such a way as to be shared through the bus interface 1130.

The processor 1100 according to the present implementation may further include an embedded memory unit 1140 that stores data, a communication module unit 1150 that can transmit and receive data to and from an external device in a wired or wireless manner, a memory control unit 1160 that drives an external memory device, and a media processing unit 1170, which processes the data processed in the processor 1100 or the data inputted from an external input device and outputs the processed data to an external interface device. The processor 1100 may include a plurality of various other modules and devices. In such cases, the plurality of modules that are added may exchange data with the core units 1110 and the cache memory unit 1120, and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and memory devices with similar functions to above mentioned memories. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or another memory with similar functions.

The communication module unit 1150 may include a module capable of being connected to a wired network, a module capable of being connected to a wireless network, or both. The wired network module may include a local area network (LAN), a universal serial bus (USB), an Ethernet, power line communication (PLC), and such various devices used to send and receive data through transmission lines. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and such various devices that may send and receive data without transmission lines.

The memory control unit 1160 may administrate and process data transmitted between the processor 1100 and an external storage device operating according to a different communication standard. The memory control unit 1160 may include various memory controllers, such as for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The media processing unit 1170 may process the data processed in the processor 1100 or the data inputted in the form of images, voice and other formats from the external input device, and output the data to the external interface device. The media processing unit 1170 may include a graphic processing unit (GPU), a digital signal processor (DSP), a high definition audio device (HD audio), and a high definition multimedia interface (HDMI) controller, as examples.

Figure 9:
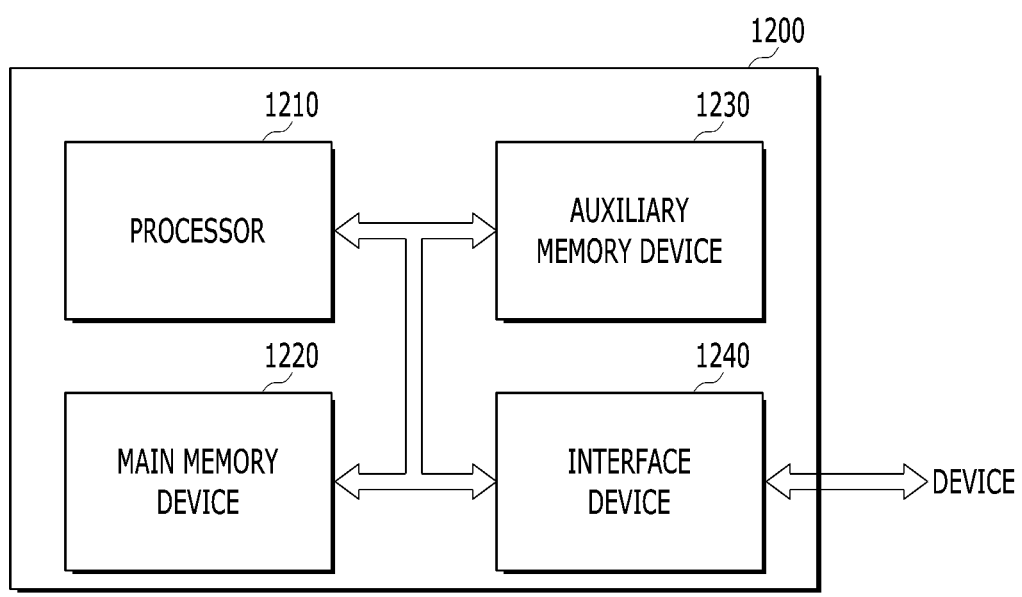
FIG. 9 is an example of a configuration diagram of a system implementing memory circuitry based on an implementation of the disclosed technology.

FIG. 9 is an example of a configuration diagram of a system implementing memory circuitry based on an implementation of the disclosed technology.

Referring to FIG. 9, a system 1200, as an apparatus for processing data, may perform input, processing, output, communication, storage and other function to conduct a series of data manipulations. The system 1200 may include a processor 1210, a main memory device 1220, an auxiliary memory device 1230, and an interface device 1240. The system 1200 of the present implementation may take various forms of electronic systems that operate using processors, such as for example a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, or a smart television.

The processor 1210 may decode inputted commands and control and perform operations on the data stored in the system 1200, such as comparison operations. The processor 1210 may include for example a microprocessor unit (MPU), a central processing unit (CPU), a single/multi-core processor, a graphic processing unit (GPU), an application processor (AP), or a digital signal processor (DSP).

The main memory device 1220 is a storage that can temporarily store, call and execute program codes or data from the auxiliary memory device 1230 when programs are executed, and can conserve or retain memorized contents even when power supply is cut off. The main memory device 1220 may include one or more of the above-described semiconductor devices in accordance with embodiments of the disclosure. For example, the main memory device 1220 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction intersecting with the first direction. The memory cell may be positioned between the first conductive line and the second conductive line. The liner layer may be configured to surround the memory cell. The liner layer may include a potential well. Therefore, semiconductor memory devices with improved operation characteristics may be used. Through this, the main memory device 1220 and the system 1200 may have improved reliability.

Also, the main memory device 1220 may further include a volatile memory such as static random access memory (SRAM) or a dynamic random access memory (DRAM), in which all contents are erased when power supply is cut off. In such cases, the main memory device 1220 may not include the semiconductor devices according to embodiments of the disclosure.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with embodiments of the disclosure. For example, the auxiliary memory device 1230 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction that intersects the first direction. The memory cell may be positioned between the first conductive line and the second conductive line. The liner layer may be configured to surround the memory cell. The liner layer may include a potential well. Therefore, semiconductor memory devices with improved operation characteristics may be provided. Through this, the auxiliary memory device 1230 and the system 1200 may have improved reliability.

Also, the auxiliary memory device 1230 may further include a data storage system (see the reference numeral 1300 of FIG. 10) such as for example a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card. In such cases, the auxiliary memory device 1230 may not include the semiconductor devices according to embodiments of the disclosure, but instead may include data storage systems, examples of which are listed above.

The interface device 1240 may perform exchange of commands and data between the system 1200 of the present implementation and an external device. The interface device 1240 may be for example a keypad, a keyboard, a mouse, a speaker, a mike, a display, various human interface devices (HIDs), or a communication device. The communication device may include a module capable of being connected with a wired network, a module capable of being connected with a wireless network, or both. The wired network module may include a local area network (LAN), a universal serial bus (USB), an Ethernet, power line communication (PLC), or various other devices that send and receive data through transmit lines. The wireless network module may include for example Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), or such various other devices that send and receive data without transmission lines.

Figure 10:
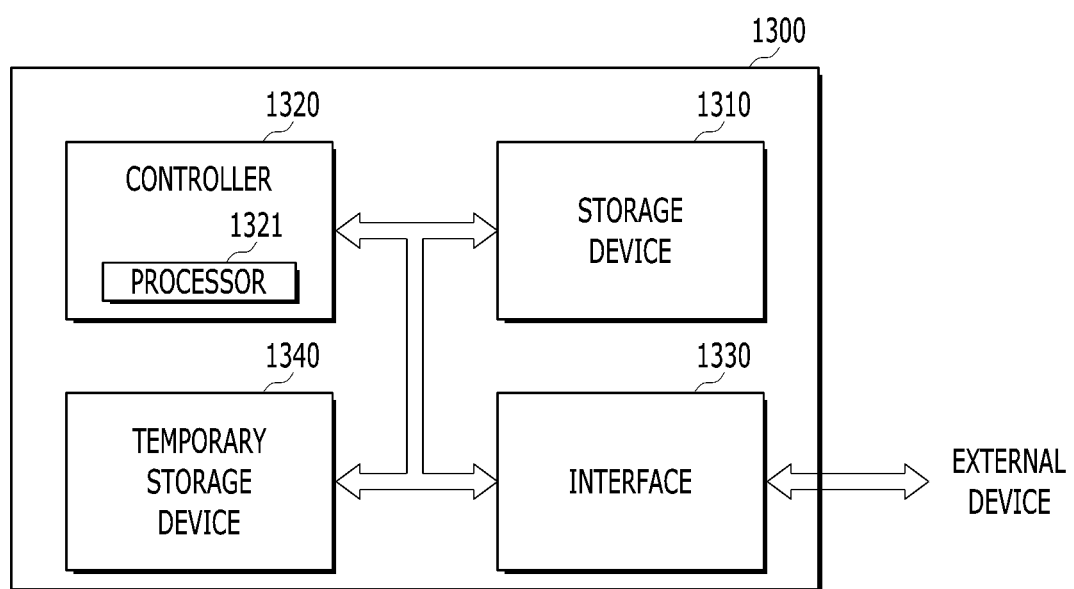
FIG. 10 is an example of configuration diagram of a data storage system implementing memory circuitry based on implementations of the disclosed technology.

FIG. 10 is an example of configuration diagram of a data storage system implementing memory circuitry based on implementations of the disclosed technology.

Referring to FIG. 10, a data storage system 1300 may include a storage device 1310 that has a nonvolatile characteristic as a component for storing data, a controller 1320 that controls the storage device 1310, an interface 1330 for connection with an external device, and a temporary storage device 1340 for storing data temporarily. The data storage system 1300 may be a disk type such as for example a hard disk drive (HDD), a compact disc read only memory (CDROM), a digital versatile disc (DVD), or a solid state disk (SSD). The data storage system 1300 may also be a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card, as examples.

The storage device 1310 may include a nonvolatile memory that stores data semi-permanently. The nonvolatile memory may include for example a ROM (read only memory), a NOR flash memory, a NAND flash memory, a phase change random access memory (PRAM), a resistive random access memory (RRAM), or a magnetic random access memory (MRAM).

The controller 1320 may control the exchange of data between the storage device 1310 and the interface 1330. To this end, the controller 1320 may include a processor 1321 for performing an operation and for processing commands inputted through the interface 1330 from outside of the data storage system 1300, by way of non-limiting examples.

The interface 1330 performs the exchange of commands and data between the data storage system 1300 and the external device. If the data storage system 1300 is a card type, then the interface 1330 may be compatible with interfaces that are used in devices, such as for example a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card, or the interface 1330 may be compatible with interfaces that are used in similar devices. If the data storage system 1300 is a disk type, then the interface 1330 may be compatible with interfaces such as for example IDE (Integrated Device Electronics), SATA (Serial Advanced Technology Attachment), SCSI (Small Computer System Interface), eSATA (External SATA), PCMCIA (Personal Computer Memory Card International Association), or a USB (universal serial bus), or may be compatible with interfaces similar to the above mentioned interfaces. The interface 1330 may be compatible with one or more different types of interfaces.

The temporary storage device 1340 can store data temporarily for efficiently transferring data between the interface 1330 and the storage device 1310 according to differences in performance of interfaces with an external device, a controller and a system. The temporary storage device 1340 for temporarily storing data may include one or more of the above-described semiconductor devices in accordance with embodiments of the disclosure. For example, the temporary storage device 1340 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction intersecting with the first direction. The memory cell may be positioned between the first conductive line and the second conductive line. The liner layer may be configured to surround the memory cell. The liner layer may include a potential well. Therefore, semiconductor memories with improved operation characteristics may be provided and as a result the temporary storage device 1340 and the data storage system 1300 may have improved reliability.

Figure 11:
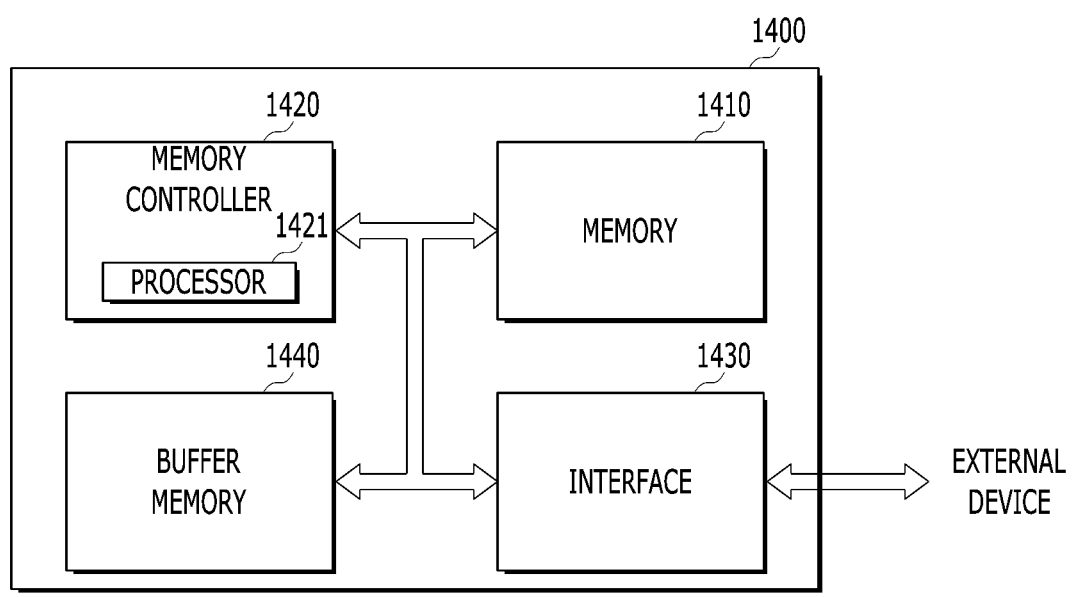
FIG. 11 is an example of a configuration diagram of a memory system implementing memory circuitry based on implementations of the disclosed technology.

FIG. 11 is an example of a configuration diagram of a memory system implementing memory circuitry based on implementations of the disclosed technology.

Referring to FIG. 11, a memory system 1400 may include a memory 1410 that has a nonvolatile characteristic as a component for storing data, a memory controller 1420 that controls the memory 1410, and an interface 1430 for connection with an external device. The memory system 1400 may be for example a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The memory 1410 for storing data may include one or more of the above-described semiconductor devices in accordance with embodiments of the disclosure. For example, the memory 1410 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction that intersects with the first direction. The memory cell may be positioned between the first conductive line and the second conductive line. The liner layer may be configured to surround the memory cell. The liner layer may include a potential well. Therefore, semiconductor memory devices with improved operation characteristics may be utilized to result in the memory 1410 and the memory system 1400 with improved reliability.

Also, the memory 1410 according to the present implementation may further include a ROM (read only memory), a NOR flash memory, a NAND flash memory, a phase change random access memory (PRAM), a resistive random access memory (RRAM), or a magnetic random access memory (MRAM) as non-limiting examples and so on, which have characteristics of nonvolatile memories.

The memory controller 1420 may control the exchange of data between the memory 1410 and the interface 1430. To this end, the memory controller 1420 may include a processor 1421 for performing an operation for, and processing commands inputted through, the interface 1430 from an outside of the memory system 1400.

The interface 1430 exchanges commands and data between the memory system 1400 and the external device. The interface 1430 may be compatible with interfaces that are used in devices, such as for example a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card, or may be compatible with interfaces that are used in similar devices. The interface 1430 may be compatible with one or more different types of interfaces.

The memory system 1400 according to embodiments of the disclosure may further include a buffer memory 1440 for efficiently transferring data between the interface 1430 and the memory 1410 according to differences in performance of interfaces with an external device, a memory controller and a memory system. For example, the buffer memory 1440 may include a first conductive line, a second conductive line, a memory cell and a liner layer. The first conductive line may be extended in a first direction. The second conductive line may be positioned higher than the first conductive line, or positioned relatively further from a substrate. The second conductive line may be extended in a second direction intersecting with the first direction. The memory cell may be positioned between the first conductive line and the second conductive line. The liner layer may be configured to surround the memory cell. The liner layer may include a potential well. Therefore, semiconductor memory devices with improved operation characteristics may be provided and the buffer memory 1440 and the memory system 1400 may have improved reliability.

Moreover, the buffer memory 1440 may further include an SRAM (static random access memory) or a DRAM (dynamic random access memory), which have volatile memory characteristics, or may further include a phase change random access memory (PRAM), a resistive random access memory (RRAM), a spin transfer torque random access memory (STTRAM), or a magnetic random access memory (MRAM), which have nonvolatile memory characteristics. In such cases, the buffer memory 1440 may not include the semiconductor devices according to embodiments of the disclosure.

Features in the above examples of electronic devices or systems in FIGS. 7 to 11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

The above described embodiments of the present disclosure are intended to illustrate and not to limit the present disclosure. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. An electronic device comprising:
    a first conductive line extending in a first direction;
    a second conductive line arranged over the first conductive line and extending in a second direction that intersects with the first direction;
    a memory cell arranged between the first conductive line and the second conductive line in regions of intersection between the first conductive line and the second conductive line; and
    a liner layer, including a first part extending parallel to the first conductive line and formed at both sidewalls of the first conductive line and both sidewalls of the memory cell in the second direction and a second part extending parallel to the second conductive line and formed at both sidewalls of the second conducive line and both sidewalls of the memory cell in the first direction,
    wherein the first part of the liner layer and the second part of the liner layer surround the memory cell in the first direction and the second direction, wherein the liner layer includes a potential well.

2. The electronic device of claim 1, wherein the liner layer includes a plurality of layers having different energy band gaps.

3. The electronic device of claim 1, wherein the liner layer has a multi-layered structure that includes a first layer, a second layer and a third layer, which are sequentially stacked, and wherein the second layer has an energy band gap that is less than an energy band gap of the first layer and an energy band gap of the third layer.

4. The electronic device of claim 1, wherein the liner layer has a multi-layered structure that includes a first layer, a second layer and a third layer, which are sequentially stacked, and wherein the first layer and the third layer each comprise a metal oxide and the second layer comprises a semiconductor nitride.

5. The electronic device of claim 1, wherein the liner layer has a multi-layered structure that includes a first layer, a second layer and a third layer, which are sequentially stacked, and wherein the first layer and the third layer each comprise a hafnium oxide layer and the second layer comprises a nitride silicon layer.

6. The electronic device of claim 1, wherein the first part of the liner layer has an uneven shape when viewed from the second direction and the second part of the liner layer has a plate shape when viewed from the first direction.

7. The electronic device of claim 1, wherein the memory cell comprises a variable resistive material.

8. An electronic device comprising:
    a plurality of first conductive lines extending in a first direction;
    a plurality of second conductive lines arranged over the plurality of first conductive lines and extending in a second direction that intersects with the first direction;
    a plurality of memory cells arranged at intersections between the plurality of first conductive lines and the plurality of second conductive lines;
    a first liner layer formed on both sidewalls of each of the plurality of memory cells and both sidewalls of each of the plurality of first conductive lines in the second direction, wherein the first liner layer covers the both sidewalls of each of the first conductive lines; and
    a second liner layer formed on the both sidewalls of each of the plurality of memory cells and both sidewalls of each of the plurality of second conductive lines in the first direction, wherein the second liner layer covers the both sidewalls of each of the second conductive lines,
    wherein the first liner layer and the second liner layer surround each of the plurality of memory cells in the first direction and the second direction,
    wherein each of the first liner layer and the second liner layer includes a plurality of layers having different energy band gaps.

9. The electronic device of claim 8, further comprising an insulating interlayer that fills areas between the first conductive lines, the second conductive lines and the memory cells,
    wherein the insulating interlayer has an energy band gap greater than an energy band gap of an outermost layer in each of the first and second liner layers.

10. The electronic device of claim 9, wherein each of the first and second liner layers has a multi-layered structure that includes a first layer and a second layer, which are sequentially stacked, and wherein the second layer has an energy band gap that is less than an energy band gap of the first layer and the energy band gap of the insulating interlayer.

11. The electronic device of claim 8, wherein each of the first and second liner layers has a multi-layered structure that includes a first layer, a second layer and a third layer, which are sequentially stacked, and wherein the second layer has an energy band gap that is less than an energy band gap of the first layer and an energy band gap of the third layer.

12. The electronic device of claim 8, wherein each of the first and second liner layers has a multi-layered structure that includes a first layer, a second layer and a third layer, which are sequentially stacked, and wherein the first layer and the third layer each comprise a metal oxide and the second layer comprises a semiconductor nitride.

13. The electronic device of claim 8, wherein each of the first and second liner layers has a multi-layered structure that includes a first layer, a second layer and a third layer, which are sequentially stacked, and wherein the first layer and the third layer each comprise a hafnium oxide layer and the second layer comprises a nitrite silicon layer.

14. The electronic device of claim 8, wherein ends of both sidewalls of the first liner layer are configured to contact respective ends of both sidewalls of the second liner layer to surround each of the memory cells in the first and second directions, and wherein the both sidewalls of the first liner layer contact with a lowermost layer of the second liner layer.

15. The electronic device of claim 8, wherein a part of the second liner layer has an uneven shape when viewed from the second direction.

16. The electronic device of claim 8, wherein a part of the first liner layer has a plate shape when viewed from the first direction.

17. The electronic device of claim 8, wherein each of the plurality of memory cells comprises a variable resistive material.

\* \* \* \* \*